(12) United States Patent
Guo et al.

(10) Patent No.: US 10,488,710 B2
(45) Date of Patent: Nov. 26, 2019

(54) ARRAY SUBSTRATE AND METHOD FOR MANUFACTURING THE SAME, AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Hongwei Guo, Beijing (CN); Wenming Ren, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/691,203

(22) Filed: Aug. 30, 2017

(65) Prior Publication Data
US 2018/0088373 A1 Mar. 29, 2018

(30) Foreign Application Priority Data
Sep. 28, 2016 (CN) .......................... 2016 1 0862535

(51) Int. Cl.
*H01L 27/12* (2006.01)
*G02F 1/1337* (2006.01)
(Continued)

(52) U.S. Cl.
CPC .......... *G02F 1/1337* (2013.01); *G02F 1/1368* (2013.01); *G02F 1/133345* (2013.01); *G02F 1/134309* (2013.01); *G02F 2001/133357* (2013.01); *G02F 2201/121* (2013.01); *H01L 27/1248* (2013.01)

(58) Field of Classification Search
None
See application file for complete search history.

(56) References Cited

U.S. PATENT DOCUMENTS 9,316,866 B2   4/2016  Wang et al.
9,874,783 B2 *  1/2018  Huang .............. G02F 1/136227
(Continued)

FOREIGN PATENT DOCUMENTS

| CN | 104238213 A | 12/2014 |
| CN | 104460168 A | 3/2015 |
| CN | 104656315 A | 5/2015 |

OTHER PUBLICATIONS

First Office Action dated May 31, 2017 in corresponding Chinese Patent Application No. 201610862535.9.
(Continued)

*Primary Examiner* — Telly D Green
(74) *Attorney, Agent, or Firm* — Nath, Goldberg & Meyer; Joshua B. Goldberg

(57) ABSTRACT

The present disclosure provides an array substrate and a method for manufacturing the same, and a display apparatus. The array substrate comprises a base, a layer structure provided on the base, and an alignment layer provided above the layer structure, wherein, the layer structure is provided with a recessed part, and distances from at least two positions of the alignment layer surrounding the recessed part to the base are different from each other.

8 Claims, 2 Drawing Sheets

(51) Int. Cl.
*G02F 1/1333* (2006.01)
*G02F 1/1343* (2006.01)
*G02F 1/1368* (2006.01)

(56) References Cited

U.S. PATENT DOCUMENTS

| | | | |
|---|---|---|---|
| 2011/0222016 A1* | 9/2011 | Kaneko | G02F 1/13394 349/155 |
| 2013/0118580 A1 | 5/2013 | Tawada et al. | |
| 2016/0147093 A1 | 5/2016 | Zhong et al. | |
| 2016/0274401 A1 | 9/2016 | Huang et al. | |

OTHER PUBLICATIONS

Second Office Action dated Sep. 19, 2017 in corresponding Chinese Patent Application No. 201610862535.9.

* cited by examiner

ARRAY SUBSTRATE AND METHOD FOR MANUFACTURING THE SAME, AND DISPLAY APPARATUS

CROSS-REFERENCE TO RELATED APPLICATION

The present disclosure claims priority to Chinese Patent Application No. 201610862535.9 filed on Sep. 28, 2016, the disclosure of which is hereby incorporated by reference in its entirety.

TECHNICAL FIELD

The present disclosure relates to a field of display technology, and particularly, relates to an array substrate and a method for manufacturing the same, a display apparatus.

BACKGROUND

Liquid crystal display (LCD) is a common display apparatus currently. Generally, a liquid crystal display comprises an array substrate and a color filter substrate which are provided opposite to each other, and a liquid crystal layer provided between the array substrate and the color filter substrate. In order to arrange liquid crystal molecules on the array substrate and the color filter substrate in an orderly manner, alignment layers need to be formed on opposite sides of the array substrate and the color filter substrate respectively by applying alignment solution thereon.

With continuous updating and improving of a manufacturing process, the alignment solution is recently applied in an inkjet manner, which gradually replaces a conventional coating manner. Compared with the conventional coating manner, the inkjet manner has advantages of fast speed, saving material cost, easy operation and adjustment and so on. However, there is a problem that an effect of diffusion of the alignment solution (e.g., polyimide, referred to as PI) is poor when the alignment solution is applied in the inkjet manner, and particularly when the alignment solution is applied on the array substrate in the inkjet manner, because the array substrate has a relatively large surface segment difference, resulting in that the alignment solution cannot be effectively diffused, and when a case where the alignment solution will enter a recessed part and another case where the alignment solution will not enter the recessed part appear periodically, Mura will occur macroscopically.

SUMMARY

An embodiment of the present disclosure provides an array substrate comprising a base, a layer structure provided on the base, and an alignment layer provided above the layer structure, wherein, the layer structure is provided with a recessed part, and distances from at least two positions of the alignment layer surrounding the recessed part to the base are different from each other.

Optionally, distances from two positions of the alignment layer surrounding the recessed part to the base are different from each other, and the two positions are approximately symmetrical with respect to the recessed part.

Optionally, the layer structure comprises a layer where a common electrode line is located, a gate insulating layer, a planarization layer and a layer where a common electrode is located, which are provided successively above the base, the recessed part is formed by a hole penetrating through the gate insulating layer and the planarization layer, a portion of the common electrode line is exposed via the hole so that the common electrode is connected to the common electrode line through the hole.

Further optionally, the common electrode line is provided below a portion of the gate insulating layer surrounding the hole.

Further optionally, only the portion of the common electrode line is exposed via the hole.

Further optionally, the portion of the common electrode line and a portion of the base are exposed via the hole.

An embodiment of the present disclosure further provides a method for manufacturing an array substrate, the method comprises steps of:

forming a layer structure on a base, and forming a recessed part in the layer structure;

forming an alignment layer above the layer structure, wherein distances from at least two positions of the alignment layer surrounding the recessed part to the base are different from each other.

An embodiment of the present disclosure further provides a display apparatus comprising an array substrate described above.

DESCRIPTION OF EMBODIMENTS

In order to make a person skilled in the art understand technical solutions of the present disclosure better, the present disclosure will be described in detail below in conjunction with accompanying drawings and specific embodiments.

Figure 1:
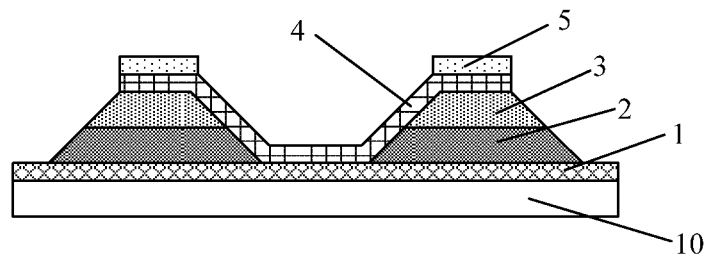
FIG. 1 shows a structural diagram of an array substrate.

FIG. 1 shows a structural diagram of an array substrate. As shown in FIG. 1, the array substrate comprises a base 10, a layer structure provided on the base 10 and an alignment layer 5 provided above the layer structure, wherein, the layer structure is provided with a recessed part, and distances from positions of the alignment layer 5 surrounding the recessed part to the base 10 are equal to each other.

First Embodiment

Figure 2:
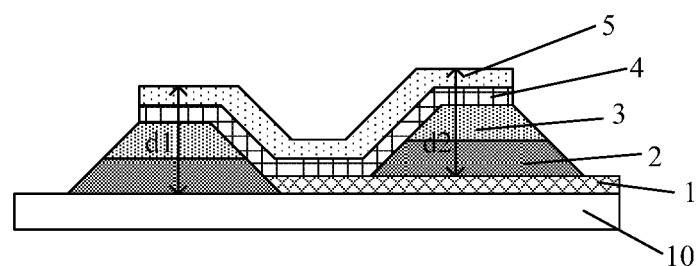
FIG. 2 shows a structural diagram of an improved array substrate in a first embodiment of the present disclosure.
Figure 3:
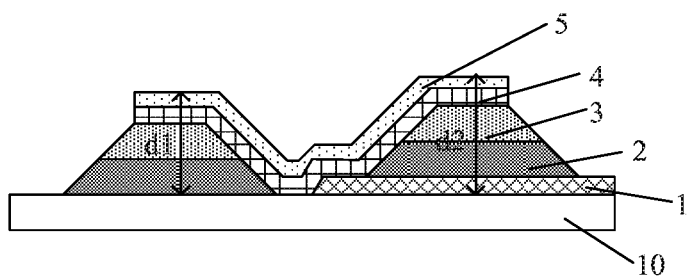
FIG. 3 shows a structural diagram of another improved array substrate in the first embodiment of the present disclosure.

Referring to FIGS. 2 and 3, the present embodiment provides an array substrate comprising a base 10, a layer structure provided on the base 10 and an alignment layer 5 provided above the layer structure, wherein, the layer structure is provided with a recessed part, and distances from at least two positions of the alignment layer 5 surrounding the recessed part to the base 10 are different from each other, e.g., d1≠d2.

In the array substrate of the present embodiment, distances from at least two positions of the alignment layer 5 surrounding the recessed part to the base 10 are different from each other, that is to say, before forming the alignment layer 5, positions of a surface of the array substrate surrounding the recessed part and distal to the base 10 are different in height, compared with the array substrate shown in FIG. 1, a surface tension of the surface of the array substrate distal to the base 10 at a position of the recessed part is reduced, so that, when applying an alignment solution on the surface of the array substrate distal to the base 10 to form the alignment layer 5, the alignment solution can flow into the recessed part of the array substrate as expected, a poor effect of display due to uneven diffusion of the alignment solution is improved.

In the array substrate of the present embodiment, distances from two positions of the alignment layer 5 surrounding the recessed part to the base 10 may be different from each other, and the two positions are approximately symmetrical with respect to the recessed part. In this case, the surface tension at the position of the recessed part can be reduced as much as possible. Specifically, the recessed part may be of a regular shape being symmetrical with respect to its axis or center, or may be of an irregular shape. When the recessed part is of a regular shape being symmetrical with respect to its axis or center, the two positions of the alignment layer 5 surrounding the recessed part may be symmetrical with the axis or center of the recessed part, and when the recessed part is of an irregular shape, the two positions of the alignment layer 5 surrounding the recessed part may be symmetrical with respect to an approximately center of the recessed part. Certainly, distances from more than two positions of the alignment layer 5 surrounding the recessed part to the base 10 may be different from each other, or distances from two positions of the alignment layer 5 surrounding the recessed part to the base 10 may be different from each other and the two positions may be asymmetric with respect to the recessed part.

Correspondingly, the present embodiment further provides a method for manufacturing an array substrate, the method comprises steps of: forming a layer structure on a base 10, and forming a recessed part in the layer structure; forming an alignment layer 5 above the layer structure, wherein, distances from at least two positions of the alignment layer 5 surrounding the recessed part to the base 10 are different from each other, which will be described in detail in conjunction with following implementations.

The array substrate of the preset embodiment is described below in conjunction with an optional implementation.

As the optional implementation of the present embodiment, the layer structure of the array substrate may comprise a layer where a common electrode line 1 is located, a gate insulating layer 2, a planarization layer 3 and a layer where a common electrode 4 is located, which are provided successively above the base 10, a hole penetrating through the gate insulating layer 2 and the planarization layer 3 is formed, the common electrode 4 is connected to the common electrode line 1 through the hole.

In the array substrate of the present embodiment, the recessed part in the layer structure is formed by the hole.

Referring to FIGS. 2 and 3, specifically, the array substrate of the present implementation comprises a base 10, a common electrode line 1 provided on the base 10, a gate insulating layer 2 provided above a layer where the common electrode line 1 is located, and a planarization layer 3 provided above the gate insulating layer 2, wherein, a hole penetrating through the gate insulating layer 2 and the planarization layer 3 is formed to expose a portion of the common electrode line 1, a common electrode 4 is provided above the planarization layer 3, and the common electrode 4 is connected to the common electrode line 1 through the hole, an alignment layer 5 is provided above a layer where the common electrode 4 is located. Compared with the array substrate shown in FIG. 1, in the array substrate of the present implementation, the common electrode line 1 is provided below a portion of the gate insulating layer surrounding the hole, another portion of the gate insulating layer 2 surrounding the hole is not provided with the common electrode line 1 below it, and in this case, it can be seen that, there are different distances from a surface of the planarization layer 3 surrounding the hole and distal to the base 10 to the base 10, that is to say, heights (thicknesses) of different positions of a side wall of the hole are different from each other, in such way, the surface tension at the position of the hole is reduced by the surface segment difference at the periphery of the hole, thus, while forming the alignment layer 5 by applying the alignment solution, the alignment solution can flow into the recessed part of the array substrate formed by the hole as expected, a poor effect of display due to uneven diffusion of the alignment solution is improved.

Although only an example in which the surface segment difference at the periphery of the hole (i.e., height difference of positions surrounding the recessed part) is achieved by providing the common electrode line 1 below a portion of the gate insulating layer 2 surrounding the hole and providing no common electrode line 1 below another portion of the gate insulating layer 2 surrounding the hole is shown, the present disclosure is not limited thereto, a person skilled in the art can choose an appropriate method as required to achieve the height difference of positions surrounding the recessed part, for example, the height difference of positions surrounding the recessed part may be achieved by providing different thicknesses of a layer in the layer structure at different positions.

Moreover, in the present embodiment, as shown in FIG. 2, the common electrode line 1 may completely cover the bottom of the hole, that is, only the common electrode line 1 is exposed through the hole so that the common electrode 4 is connected to the common electrode line 1. Certainly, as shown in FIG. 3, the common electrode line 1 may cover a portion of the bottom of the hole, that is, besides the common electrode line 1, a portion of the base 10 is also exposed through the hole, as long as a portion of the common electrode line 1 is exposed through the hole.

Figure 4:
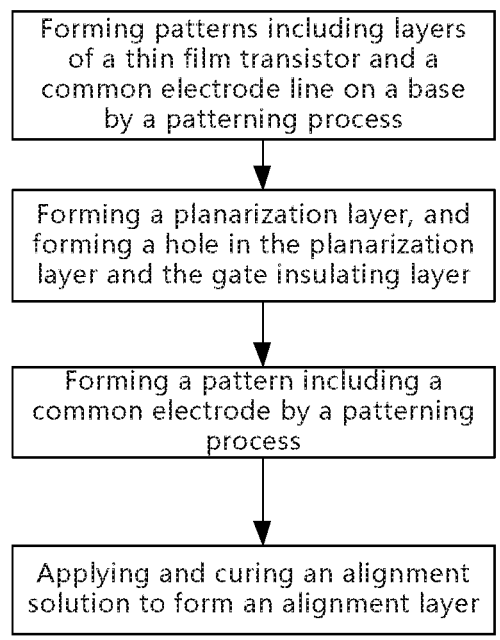
FIG. 4 shows a flowchart of a method for manufacturing the improved array substrate in the first embodiment of the present disclosure.

Correspondingly, the present implementation further provides a method for manufacturing an array substrate, which is shown in FIG. 4. In the present implementation, a patterning process may only include a photographing process, or may include the photographing process and an etching process, and in addition, may include other processes for forming a particular pattern, such as printing, ink jetting. The photographing process refers to a process for forming a pattern by using a photoresist, a mask, an exposure machine etc., and includes processes such as film forming, exposure, developing. A film may be formed by depositing, coating, sputtering or the like. The specific patterning process may be selected in accordance with the structure to be formed in the present implementation. The method for manufacturing the array substrate of the present implementation specifically comprises following first to fourth steps.

First step, forming patterns including layers of a thin film transistor and the common electrode line 1 on the base 10 by a patterning process.

As an example, the thin film transistor is a bottom gate thin film transistor, and in this case, the first step specifically comprises: forming a pattern including a gate of the thin film transistor, a gate line and the common electrode line 1 by a patterning process; then, forming the gate insulating layer 2; next, forming a pattern including an active layer of the thin film transistor by a patterning process; and then forming a pattern including a source and a drain of the thin film transistor by a patterning process.

Second step, after completing the first step, forming the planarization layer 3, for example, forming the planarization layer 3 in a coating manner; then, forming the hole in the planarization layer 3 and the gate insulating layer 2, wherein, a portion of the common electrode line 1 is exposed through hole, the common electrode line 1 is provided below a portion of the gate insulating layer 2 surrounding the hole, and another portion of the gate insulating layer 2 is not provided with the common electrode line 1 below it.

Third step, after completing the second step, forming a pattern including the common electrode 4 by a patterning process, and the common electrode 4 is connected to the common electrode line 1 through the hole.

Fourth step, after completing the third step, applying and curing an alignment solution to form the alignment layer 5, the alignment solution may be applied in an inkjet manner, which is not limited herein. A person skilled in the art can choose an appropriate manner to form the alignment layer 5 as required.

In the present implementation, the common electrode line 1 may completely cover the bottom of the hole so that the common electrode 4 can contact with the common electrode line 1 well. Certainly, the common electrode line 1 may cover a portion of the bottom of the hole, as long as a portion of the common electrode line 1 is exposed through the hole.

It should be noted that, although only an example in which the hole of the array substrate of the present implementation is used for connecting the common electrode line 1 with the common electrode 4 is described, in fact, the hole may be used for connecting the drain of the thin film transistor with a pixel electrode, and in this case, the array substrate also can be improved by the method described above.

Second Embodiment

The present embodiment provides a display apparatus comprising the array substrate of the first embodiment. With the array substrate of the first embodiment, distances from at least two positions of the alignment layer 5 surrounding the recessed part to the base 10 are different from each other, that is to say, before forming the alignment layer 5, positions of the surface of the array substrate surrounding the recessed part and distal to the base 10 are different in height, compared with the array substrate shown in FIG. 1, the surface tension of the surface of the array substrate distal to the base 10 at the position of the recessed part is reduced, so that, when applying an alignment solution on the surface of the array substrate distal to the base 10 to form the alignment layer 5, the alignment solution can flow into the recessed part of the array substrate as expected, a poor effect of display due to uneven diffusion of the alignment solution is improved.

In the present embodiment, the display apparatus may be a liquid crystal display apparatus or an electroluminescent display apparatus, for example, may be any product or member with a display function, such as a liquid crystal panel, an electronic paper, a mobile phone, a tablet computer, a television, a display, a notebook computer, a digital photo frame, a navigator.

It should be understood that, the above embodiments are merely exemplary embodiments for explaining principle of the present disclosure, but the present disclosure is not limited thereto. Various modifications and improvements may be made by those ordinary skilled in the art within the spirit and essence of the present disclosure, these modifications and improvements fall into the protection scope of the present disclosure.

The invention claimed is:

1. An array substrate, comprising a base, a layer structure provided on the base, and an alignment layer provided above the layer structure, wherein, the layer structure is provided with a recessed part, and distances from at least two positions of a top surface of the alignment layer surrounding the recessed part to the base are different from each other,
  wherein the layer structure comprises a layer where a common electrode line is located, a gate insulating layer, a planarization layer and a layer where a common electrode is located, which are provided successively above the base, the recessed part is formed by a hole penetrating through the gate insulating layer and the planarization layer, a portion of the common electrode line and a portion of the base are exposed via the hole so that the common electrode is connected to the common electrode line through the hole.

2. The array substrate of claim 1, wherein, distances from two positions of the alignment layer surrounding the recessed part to the base are different from each other, and the two positions are approximately symmetrical with respect to the recessed part.

3. The array substrate of claim 1, wherein, the common electrode line is provided below a portion of the gate insulating layer surrounding the hole.

4. The array substrate of claim 1, wherein, only the portion of the common electrode line is exposed via the hole.

5. A method for manufacturing an array substrate, the method comprises steps of:
  forming a layer structure on a base, and forming a recessed part in the layer structure;
  forming an alignment layer above the layer structure, wherein distances from at least two positions of a top surface of the alignment layer surrounding the recessed part to the base are different from each other,
  wherein the layer structure comprises a layer where a common electrode line is located, a gate insulating layer, a planarization layer and a layer where a common electrode is located, which are provided successively above the base, the recessed part is formed by a hole penetrating through the gate insulating layer and the planarization layer, a portion of the common electrode line and a portion of the base are exposed via the hole so that the common electrode is connected to the common electrode line through the hole.

6. The method of claim 5, wherein, the common electrode line is provided below a portion of the gate insulating layer surrounding the hole.

7. The method of claim 5, wherein, only the portion of the common electrode line is exposed via the hole.

8. A display apparatus, comprising an array substrate of claim 1.

* * * * *